(12) United States Patent
Kim et al.

(10) Patent No.: US 9,013,381 B2
(45) Date of Patent: Apr. 21, 2015

(54) ORGANIC LIGHT EMITTING DIODE DISPLAY COMPRISING A DOT THAT INCLUDES TWO BLUE PIXELS

(75) Inventors: Hyo-Seok Kim, Namyangju-si (KR); Kyong-Tae Park, Suwon-si (KR)

(73) Assignee: Samsung Display Co., Ltd. (KR)

( * ) Notice: Subject to any disclaimer, the term of this patent is extended or adjusted under 35 U.S.C. 154(b) by 827 days.

(21) Appl. No.: 12/199,672

(22) Filed: Aug. 27, 2008

(65) Prior Publication Data
US 2009/0128458 A1 May 21, 2009

(30) Foreign Application Priority Data
Nov. 16, 2007 (KR) .................. 10-2007-0117378

(51) Int. Cl.
G09G 3/32 (2006.01)
H01L 27/32 (2006.01)

(52) U.S. Cl.
CPC ...... G09G 3/3233 (2013.01); G09G 2300/0452 (2013.01); G09G 2300/0465 (2013.01); H01L 27/3211 (2013.01); H01L 27/3213 (2013.01)

(58) Field of Classification Search
CPC .............. G09G 3/3225; G09G 2300/0452; G09G 2300/0465; H01L 27/3211; H01L 27/3213
USPC .............................................. 345/76, 82–83
See application file for complete search history.

(56) References Cited

U.S. PATENT DOCUMENTS

| | | | |
|---|---|---|---|
| 6,359,671 B1 * | 3/2002 | Abileah | 349/119 |
| 6,747,618 B2 * | 6/2004 | Arnold et al. | 345/77 |
| 6,897,855 B1 * | 5/2005 | Matthies et al. | 345/204 |
| 7,027,015 B2 * | 4/2006 | Booth et al. | 345/83 |
| 2003/0128179 A1* | 7/2003 | Credelle | 345/88 |
| 2004/0174375 A1* | 9/2004 | Credelle et al. | 345/589 |
| 2006/0055639 A1* | 3/2006 | Yamada | 345/77 |
| 2006/0146351 A1* | 7/2006 | Lo et al. | 358/1.9 |
| 2007/0057876 A1* | 3/2007 | Kwon | 345/76 |
| 2007/0080909 A1* | 4/2007 | Jeon et al. | 345/77 |
| 2007/0216610 A1* | 9/2007 | Smith | 345/76 |

FOREIGN PATENT DOCUMENTS

| | | | |
|---|---|---|---|
| KR | 10-2004-0017786 A | 2/2004 | |
| KR | 2005-0097120 | 10/2005 | |
| KR | 2006-0095132 | 8/2006 | |
| KR | 2007-0024286 | 3/2007 | |
| KR | 10-2007-0040004 A | 4/2007 | |
| KR | 709227 B1 * | 4/2007 | H05B 33/14 |
| KR | 2007-0051224 | 5/2007 | |

OTHER PUBLICATIONS

English translation of Korean Publication 10-2007-0024286.*

* cited by examiner

Primary Examiner — Chanh Nguyen
Assistant Examiner — John Kirkpatrick
(74) Attorney, Agent, or Firm — Innovation Counsel LLP

(57) ABSTRACT

Disclosed is an organic light emitting device which includes a first pixel displaying red, a second pixel displaying green, a third pixel displaying blue, and a fourth pixel displaying blue and forming a dot along with the first pixel, the second pixel, and the third pixel. The first to fourth pixels include a switching element and an organic light emitting element connected to the switching element, and the sum of the areas of the first to fourth pixels is substantially the same as the area of the dot.

12 Claims, 5 Drawing Sheets

ORGANIC LIGHT EMITTING DIODE DISPLAY COMPRISING A DOT THAT INCLUDES TWO BLUE PIXELS

CROSS-REFERENCE TO RELATED APPLICATION

This application claims priority to and the benefit of Korean Patent Application No. 10-2007-0117378 filed in the Korean Intellectual Property Office on Nov. 16, 2007, the entire contents of which are incorporated herein by reference.

BACKGROUND OF THE INVENTION (a) Field of the Invention

The present invention relates to an organic light emitting device.

(b) Description of the Related Art

Recent trends toward lightweight and thin personal computers and televisions sets also require lightweight and thin display devices, and flat panel displays such as a liquid crystal display (LCD) satisfying such requirements are being substituted for conventional cathode ray tubes (CRTs). However, because the LCD is a passive display device, an additional back-light as a light source is needed, and the LCD has various problems such as a slow response time and a narrow viewing angle.

Among the flat panel displays, an organic light emitting device has recently been the most promising as a display device for solving these problems. The organic light emitting device includes two electrodes and an organic light emitting layer interposed between the two electrodes. One of the two electrodes injects holes and the other injects electrons into the light emitting layer. The injected electrons and holes are combined to form excitons and the excitons emit light as discharge energy.

Because an organic light emitting device is a self-emissive display device, an additional light source is not necessary and accordingly a organic light emitting device has a lower power consumption when compared to an LCD, as well as a high response speed, wide viewing angle, and a high contrast ratio. The light emitting layer is made of an organic material that uniquely emits light of one of three primary colors, such as red, green, and blue, and the organic light emitting device spatially mixes the light having primary colors emitted form the emission layer so as to display desired images.

The above information disclosed in this Background section is only for enhancement of understanding of the background of the invention and therefore it may contain information that does not form the prior art that is already known in this country to a person of ordinary skill in the art.

SUMMARY OF THE INVENTION

The organic light emitting device includes a plurality of pixels such as red pixels, blue pixels, and green pixels, and light from these pixels is mixed to display full colors.

However, the organic light emitting device has different light emitting efficiency according to light emitting materials of red, green, and blue. Accordingly, the pixels must be designed based on a region having the lowest light emitting efficiency, and therefore the aperture ratio may be largely deteriorated.

The present invention is to improve the aperture ratio as well as to secure good current driving characteristics of the organic light emitting device.

An organic light emitting device according to an exemplary embodiment of the present invention includes a first pixel displaying red, a second pixel displaying green, a third pixel displaying blue, and a fourth pixel displaying blue, and forming a dot along with the first pixel, the second pixel, and the third pixel, wherein the first to fourth pixels respectively include a switching element and an organic light emitting element connected to the switching element, and the sum of areas of the first to fourth pixels is substantially the same as the area of the dot.

The area sum of the third pixel and the fourth pixel may be larger than each area of the first pixel and the second pixel.

The first to fourth pixels may respectively include an organic light emitting material, and the organic light emitting material of the third and fourth pixels may have a shorter life than the life of the organic light emitting material of the first and second pixels under the same conditions.

The first to fourth pixels may form a rectangle including long sides and short sides, and the first to fourth pixels may be arranged in a line in the extended direction of the short sides.

The length of each long side of the first to fourth pixels may be four times the length of the short sides.

The first to fourth pixels may form a 2×2 matrix.

Each of the first to fourth pixels may be a square

The areas of each of the first to fourth pixels may be substantially the same.

Voltages applied to the third and fourth pixels may be different from each other.

Voltages applied to the third and fourth pixels may be the same.

The organic light emitting device may further include a signal controller generating output image signals for the first to fourth pixels based on the input image signals of red, green, and blue for representing luminance, and a data driver generating data voltages corresponding to the output image signals to apply to the first to fourth pixels, wherein each pixel may emit light according to the data voltages, and a luminance sum of the third pixel and the fourth pixel may be substantially the same as the luminance of the input image signal of the blue.

The number of grays that the third pixel and the fourth pixel may respectively represent may be the same as the number of grays that the first pixel and the second pixel may represent.

The number of grays that the third pixel and the fourth pixel may respectively represent may be less than the number of grays that the first and second pixels may represent.

DETAILED DESCRIPTION OF THE EMBODIMENTS

Figure 1:
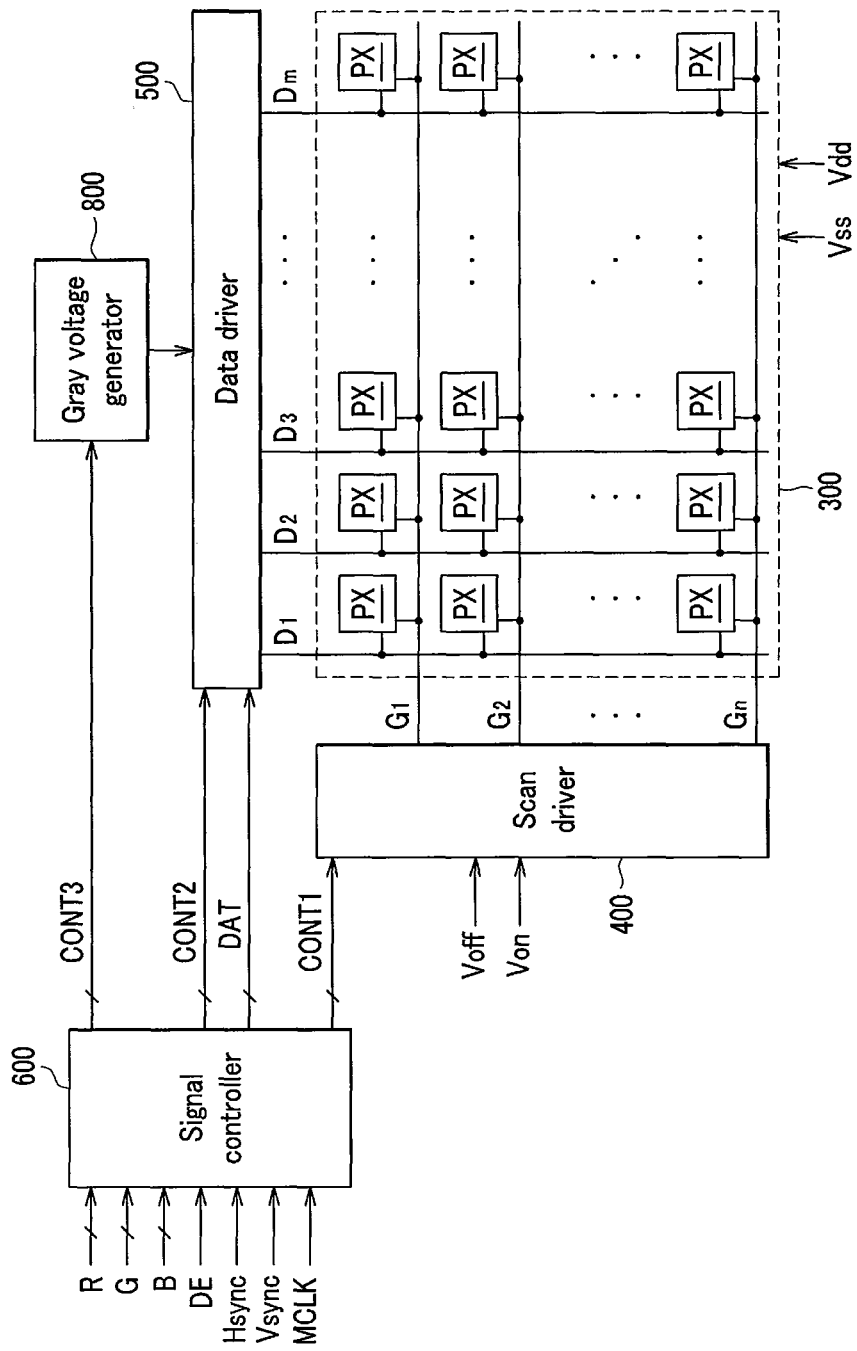
FIG. 1 is a block diagram of an organic light emitting device according to an exemplary embodiment of the present invention.

The present invention is described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
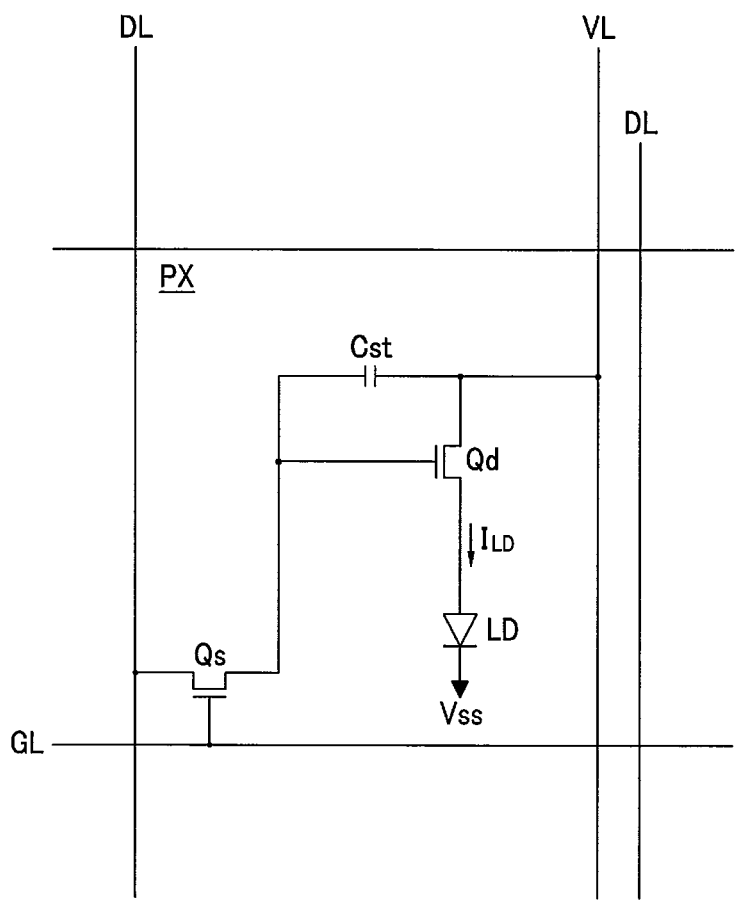
FIG. 2 is an equivalent circuit diagram of one pixel in the organic light emitting device according to an exemplary embodiment of the present invention.

FIG. 1 is a block diagram of an organic light emitting device according to an exemplary embodiment of the present invention, and FIG. 2 is an equivalent circuit diagram of one pixel in the organic light emitting device according to an exemplary embodiment of the present invention.

Referring to FIG. 1, an organic light emitting device according to an exemplary embodiment of the present invention includes a display panel assembly 300, a scan driver 400 and a data driver 500 connected thereto, a gray voltage generator 800, and a signal controller 600.

Referring to the equivalent circuit, the display panel assembly 300 includes a plurality of signal lines $G_1$-$G_n$ and $D_1$-$D_m$, and a plurality of pixels PX connected to the signal lines $G_1$-$G_n$ and $D_1$-$D_m$ and arranged substantially in a matrix structure.

The signal lines $G_1$-$G_n$ and $D_1$-$D_m$ include a plurality of scanning lines $G_1$-$G_n$ transmitting scanning signals, a plurality of data lines $D_1$-$D_m$ transmitting data signals, and a plurality of driving voltage lines VL (referring to FIG. 2) transmitting a driving voltage Vdd. The scanning lines $G_1$-$G_n$ extend substantially in a row direction and are substantially parallel to each other, the data lines $D_1$-$D_m$ extend substantially in a column direction and are substantially parallel to each other, and the driving voltage lines VL extend substantially in a column direction and are substantially parallel to each other.

Referring to FIG. 2, each driving voltage line VL is substantially parallel to a data line DL, and the driving voltage Vdd is applied from the lower or upper edge of the display panel 300. However, the driving voltage line VL may be parallel to the scanning signal line GL.

Each pixel PX of the organic light emitting device according to an exemplary embodiment of the present invention includes an organic light emitting element LD, a driving transistor Qd, a storage capacitor Cst, and a switching transistor Qs.

The switching transistor Qs includes a control terminal connected to the scanning line GL, an input terminal connected to the data line DL, and an output terminal connected to the driving transistor Qd. The switching transistor Qs transmits data signals applied to the data line DL in response to a scanning signal applied to the scanning line GL.

The driving transistor Qd has a control terminal connected to the switching transistor Qs, an input terminal connected to the driving voltage line VL, and an output terminal connected to the organic light emitting diode LD. The driving transistor Qd drives an output current ILD having a magnitude depending on the voltage between the control terminal and the output terminal thereof, and outputs it to the organic light emitting diode LD The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting diode LD as an organic light emitting diode (OLED) has an anode connected to the output terminal of the driving transistor Qd and a cathode connected to a common voltage Vss. The organic light emitting diode LD emits light having an intensity depending on an output current ILD of the driving transistor Qd, thereby displaying images. Here, the organic light emitting element LD includes an organic material that uniquely emits light of one of three primary colors, such as red, green, and blue, and the organic light emitting device spatially mixes the light having primary colors emitted from the emission layer so as to display desired images.

The switching transistor Qs and the driving transistor Qd are n-channel field effect transistors (FETs) including amorphous silicon or polysilicon. However, at least one of the switching transistor Qs and the driving transistor Qd may be a p-channel FET. In addition, the connections among the transistors Qs and Qd, the capacitor Cst, and the organic light emitting diode LD may be modified.

Each pixel uniquely emits light of one of primary colors, and an example of the primary colors may be three primary colors such as red, green, and blue. Hereafter, the pixels displaying red, green, and blue are respectively referred to as a red pixel, a green pixel, a blue pixel, and the reference numerals thereof are respectively RP, GP, and BP. In the present exemplary embodiment, one red pixel RP, one green pixel GP, and two blue pixels BP form a dot, which is a primary unit for displaying images, and the dots are arranged as a matrix to thereby form the screen of the display device.

Next, the arrangement of the pixels is described in detail with reference to FIG. 3 and FIG. 4.

Figure 3:
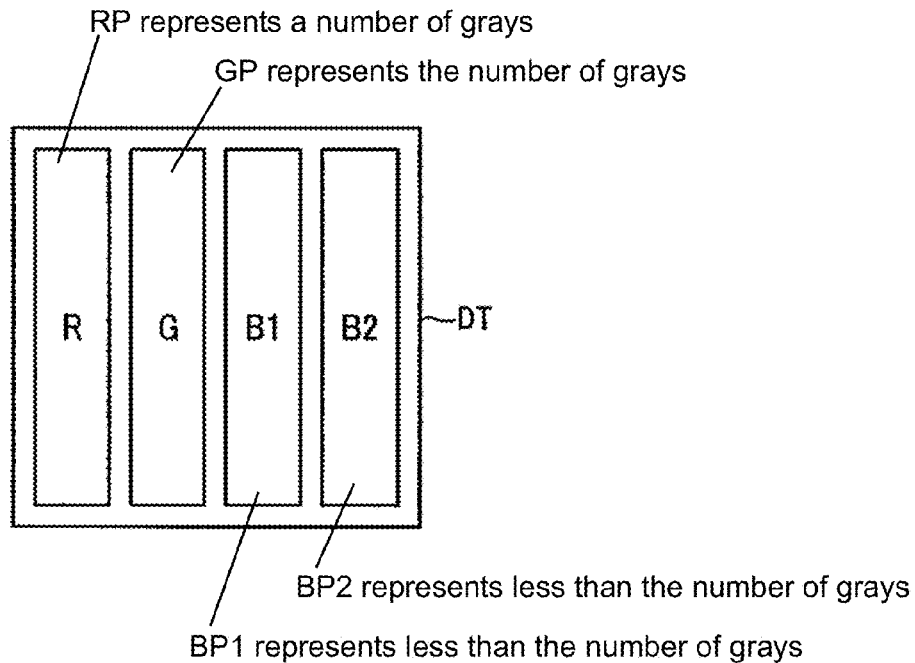
FIG. 3 is a view showing a pixel arrangement in an organic light emitting diode device according to an exemplary embodiment of the present invention.
Figure 4:
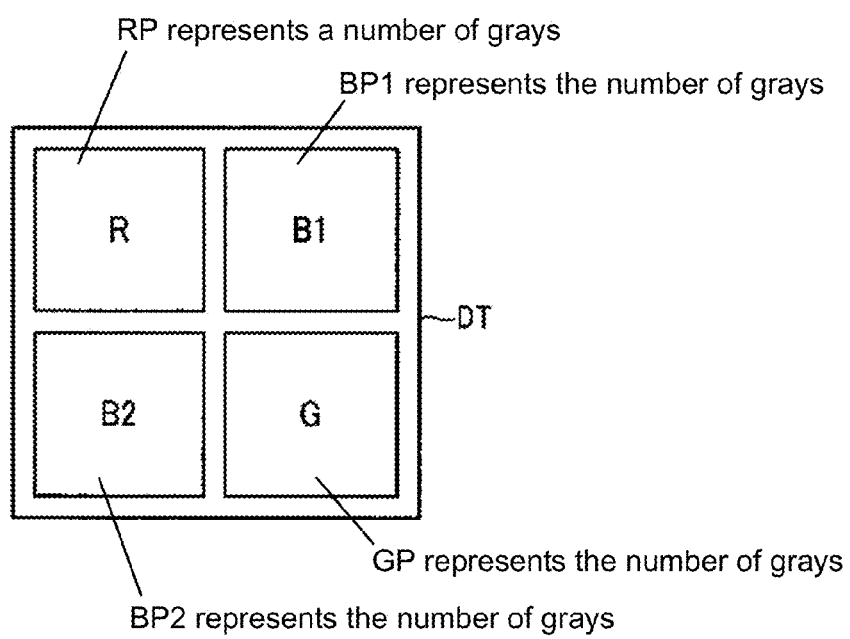
FIG. 4 is a view showing a pixel arrangement in an organic light emitting diode device according to another exemplary embodiment of the present invention.

FIG. 3 is a plan view showing a pixel arrangement in the organic light emitting device according to an exemplary embodiment of the present invention, and FIG. 4 is a plan view showing a pixel arrangement in the organic light emitting device according to another exemplary embodiment of the present invention.

Referring to FIG. 3, a red pixel RP, indicated by R in the figure, a green pixel GP, indicated by G in the figure, a first blue pixel BP1 (B1 in the figure) and a second blue pixel BP2, shown as B2 in the figure, are sequentially arranged in the row direction forming a dot, indicated by reference character DT. However, the arrangement order of the pixels PX may be modified.

Although not shown, the pixels PX of each pixel column may display the same color.

Each pixel PX may be a rectangle, a length of horizontal sides may be shorter than a length b of vertical sides, and particularly the length b of the vertical sides may be about four times the length a of the horizontal sides.

The area sum of the first blue pixel BP1 and the second blue pixel BP2 may be larger than the area of the red pixel RP and less than the area of the green pixel GP.

The areas of the pixels PX may be substantially the same, particularly if the length b of the vertical sides is four times the length a of the horizontal sides, and each dot DT is substantially a square. In this case, the total area of the pixels BP1 and BP2 displaying the blue color is about two times the area of the pixel RP displaying the red color and the area of the pixel GP displaying the green color.

However, the area of the pixels PX may be different from each other, and particularly the areas of the red pixel RP and the green pixel GP may be the same, while the first and second blue pixels BP1 and BP2 may be smaller than them. In this case, the areas of the first blue pixel BP1 and the second blue pixel BP2 may be the same as or different from each other.

As illustrated in FIG. 4 and in contrast to FIG. 3, a red pixel RP, a green pixel GP, a first blue pixel BP1, and a second blue pixel BP2 may be arranged in the column direction in each dot, wherein the pixel arrangement of the dot becomes a shape like that of FIG. 3 rotated by 90 degrees.

Referring to FIG. 4, a red pixel RP, a green pixel GP, a first blue pixel BP1, and a second blue pixel BP2 are arranged as a 2×2 matrix in each dot DT. The red pixel RP and the green pixel GP are opposite in the diagonal direction, and the first blue pixel BP1 and the second blue pixel BP2 are opposite in the diagonal direction. However, the positions of the pixels PX may be changed.

Each pixel RP, GP, BP1, and BP2 may be square in which the length c of the horizontal sides and the length d of the vertical sides are substantially the same.

The areas of the pixels PX may be substantially the same, and each dot DT is substantially a square. While the square shape of the dot DT is maintained, the areas of the pixels PX may be different from each other. In this case, the areas of the red pixel RP and the green pixel GP are the same and the first and second blue pixels BP1 and BP2 may be smaller than them, and the shapes of the pixels PX may be rectangular rather than square.

Referring to FIG. 1 again, the gray voltage generator 800 generates a plurality of reference gray voltages related to the luminance of the pixels PX.

The scan driver 400 synthesizes a high voltage Von and a low voltage Voff for turning on and turning off the switching transistor Qs connected to the scanning signal lines $G_1$-$G_n$ to generate the scanning signals for application to the scanning signal lines $G_1$-$G_n$.

The data driver 500 is connected to the data lines $D_1$-$D_m$, and applies data signals, which are generated from the gray voltages supplied from the gray voltage generator 800, to the data lines $D_1$-$D_m$.

The signal controller 600 controls the operations of the scan driver 400, the data driver 500, and the gray voltage generator 800.

Each of the driving devices 400, 500, 600, and 800 may be integrated into the display panel assembly 300 along with the signal lines $G_1$-$G_n$ and $D_1$-$D_m$, the thin film transistors Qd, and the switching elements Qs. Alternatively, the driving devices 400, 500, 600, and 800 may include at least one integrated circuit (IC) chip mounted on the display panel assembly 300 or on a flexible printed circuit (FPC) film in a tape carrier package (TCP) type, which are attached to the display panel assembly 300. Furthermore, all the driving devices 400, 500, 600, and 800 may be integrated into a single IC chip, but at least one of the driving devices 400, 500, 600, and 800 or at least one circuit element in at least one of the driving devices 400, 500, 600, and 800 may be disposed outside of the single IC chip.

Now, the operation of the above-described organic light emitting device is described below in detail.

The signal controller 600 is supplied with input image signals Rin, Gin, and Bin, and input control signals for controlling the display thereof from an external graphics controller (not shown). The input image signals Rin, Gin, and Bin include luminance information of each pixel PX, and the luminance includes a determined number of gray levels, e.g., 1024 ($=2^{10}$), 256 ($=2^8$), or 64 ($=2^6$) gray levels. However, the luminance information included in the input image signals Rin, Gin, and Bin generally assumes the case in which the number of pixels forming one dot DT are three of red, green, and blue, and the reference numerals Rin, Gin, and Bin respectively indicate these colors. The input control signals include a vertical synchronization signal Vsync, a horizontal synchronization signal Hsync, a main clock signal MCLK, and a data enable signal DE.

On the basis of the input control signals and the input image signals Rin, Gin, and Bin, the signal controller 600 generates a scan control signal CONT1, a data control signal CONT2 and a gray voltage control signal CONT3 and processes the image signals Rin, Gin, Bin to be suitable for the operation conditions and the structure of the panel assembly 300 to generate output image signals Rout, Gout, B1out, and B2out for the red pixel RP, the green pixel GP, the first blue pixel BP1, and the second blue pixel BP2. The signal controller 600 sends the scan control signals CONT1 to the scan driver 400, sends the gray voltage control signal CONT3 to the gray voltage generator 800, and sends the data control signal CONT2 and the output image signals Rout, Gout, B1out, and B2out to the data driver 500.

The gray voltage generator 800 generates the reference gray voltages from the signal controller 600 and provides them to the data driver 500.

The data driver 500 divides the reference gray voltages to generate all gray voltages. Responsive to the data control signals CONT2 from the signal controller 600, the data driver 500 receives output image signals Rout, Gout, B1out, and B2out for a row of pixels from the signal controller 600, converts the output image signals Rout, Gout, B1out, and B2out into analog data voltages by selecting gray voltages corresponding to the respective digital image signals Rout, Gout, B1out, and B2out, and applies the digital image signals DAT to the data lines $D_1$-$D_m$.

The scan driver 400 converts the scanning signals applied to the scanning lines $G_1$-$G_n$ into the high voltage Von in response to the scanning control signals CONT1 from the signal controller 600, thereby turning on the switching transistors Q connected thereto. Thus, the switching transistor Qs connected to the scanning signal lines $G_1$-$G_n$ are turned on such that the data voltages applied to the data lines $D_1$-$D_m$ are supplied to the control terminal of the driving transistor Qd of the corresponding pixel PX.

The data voltages applied to the driving transistor Qd are charged to the capacitor Cst, and the charged voltages are maintained after the switching transistor Qs is turned off. The driving transistor Qd applied with the data voltage is turned on and outputs the output current $I_{LD}$ having a value depend on the data voltage. The organic light emitting element LD emits light having an intensity depending on the magnitude of the driving current $I_{LD}$ such that the corresponding pixel PX displays images.

By repeating this procedure by a unit of a horizontal period (also referred to as "1H" and that is equal to one period of the horizontal synchronization signal Hsync and the data enable signal DE), all scanning signal lines $G_1$-$G_n$ are sequentially supplied with the scanning signal, thereby applying the data signals to all pixels PX to display an image for a frame.

Here, the data voltages applied to the first blue pixel BP1 and the second blue pixel BP2, and the corresponding output image signals B1out and B2out, are determined for the luminance sum of the first blue pixel BP1 and the second blue pixel BP2 to be the same as the luminance represented by the input image signal Bin for the blue. However, because the luminance of the pixel is an increasing function for the area and the data voltage of the pixel, if the area of the pixel is increased in the condition that the same luminance is maintained, the data voltage must be decreased. Accordingly, when the area sum of two blue pixels BP1 and BP2 is larger than the area of the blue pixel in the case for one pixel for the blue, the data voltages respectively applied to two blue pixels BP1 and BP2 are relatively lower.

The life of the organic light emitting device is closely connected with the life of the organic emitting material included to the organic light emitting element LD of each pixel PX, and the life of the organic emitting material depends on the magnitude and the application time of the inner flowing current. That is to say, the life of the organic emitting light material is decreased according to an increase of the magnitude of the inner current and extension of the application time. The magnitude of the inner current of the organic emitting light material is increased according to an increase of the voltage applied to the control terminal of the driving transistor Qd, that is, an increase of the data voltage. Therefore, the life of the pixel PX is extended according to the magnitude of the decrease of the applied data voltage.

However, the organic material emitting the blue light has a relatively shorter life compared to that of the organic material emitting the red light and the organic material emitting the green light with current technology. Therefore, if the data voltage applied to the two blue pixels BP1 and BP2 is decreased, the life of the two blue pixels BP1 and BP2 is increased such that the case in which the use of the organic light emitting device is reduced due to the end of the life of the blue pixel may be reduced.

On the other hand, the number of grays that each blue pixel BP1 and BP2 may represent is equal to or less than the number of grays that the red pixel RP and the green pixel GP may respectively represent.

For example, when equal gray voltages are used for all pixels PX, because each of the blue pixels BP1 and BP2 is applied with a gray voltage having a small magnitude among all gray voltages, the number of grays that may be represented is small. Then, the bit number of the output image signals B1out and B2out for the blue pixels BP1 and BP2 may be reduced, and accordingly the number of signal transmission lines to the data driver 500 from the signal controller 600 may be reduced.

However, even if the gray voltages for the blue pixels BP1 and BP2 are separately made, if their number is the same as the number of gray voltages for the red pixel RP and the green pixel GP, the number of grays that each blue pixel BP1 and BP2 may represent becomes the same as the number of grays that the red pixel RP and the green pixel GP may respectively represent. In this case, the number of grays that two blue pixels BP1 and BP2 may together represent becomes two times the grays that the red pixel RP and the green pixel GP may respectively represent. Accordingly, the color expression of the blue may be more various, and the color diversity may reduce the deterioration of the image quality due to noise that is particularly largely generated when the signals are compressed and transmitted.

Also, the number of grays that each pixel PX may represent is determined by the bit number of the signal that the data driver 500 may process, and if the number of grays that each of the blue pixels BP1 and BP2 may represent is equal to the number of grays that the red pixel RP and the green pixel GP may respectively represent, when the bit number of the input image signals Rin, Gin, and Bin is higher than the bit number of the signal that the data driver 500 may process, for example when the bit number of the input image signal is $2^9$ and the bit number of the signal that the data driver 500 may process is $2^8$, the blue image may be displayed without a loss. Here, the loss may be reduced through spatial or temporal dithering regarding the red pixel RP and the green pixel GP.

In the above description, the organic light emitting device is a voltage entry type in which the pixel is applied with the data voltage, but the present invention may be adapted to a case of a current entry in which the pixel is applied with the current for emitting the light.

Now, the detail structure of the display in the organic light emitting device according to an exemplary embodiment of the present invention will be described with reference to FIG. 5 and FIG. 6.

Figure 5:
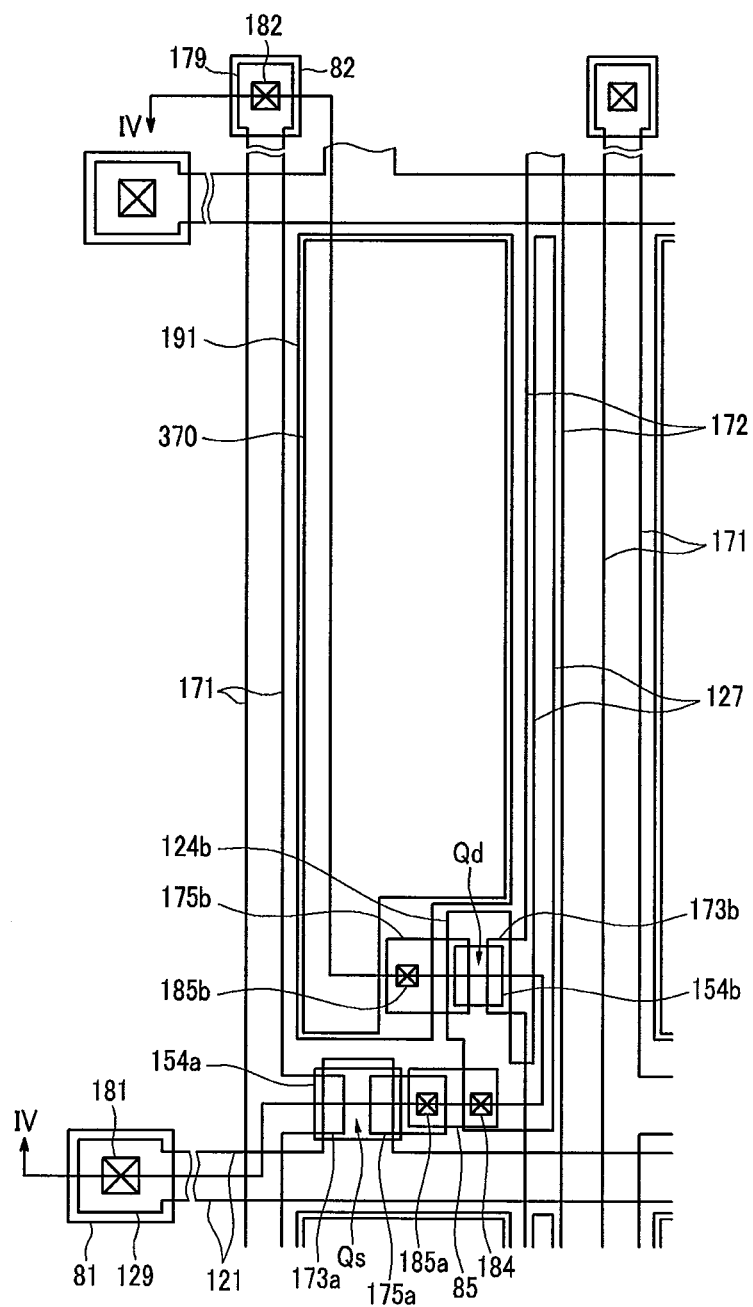
FIG. 5 is a layout view of an organic light emitting device according to an exemplary embodiment of the present invention.
Figure 6:
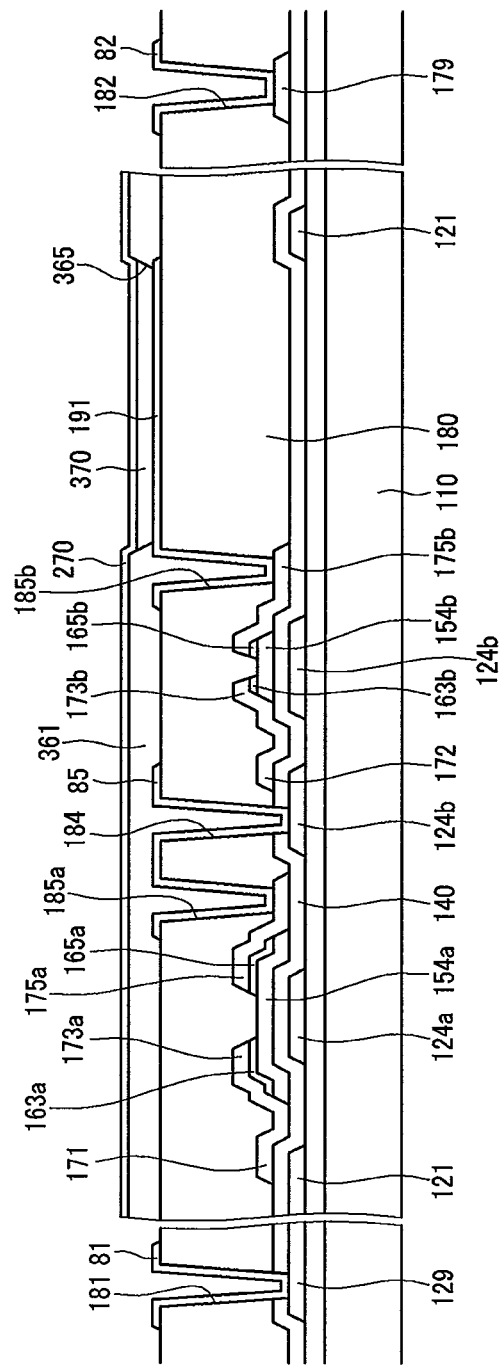
FIG. 6 is a cross-sectional view of the organic light emitting device shown in FIG. 5 taken along the line VI-VI.

FIG. 5 is a layout view of a display panel in an organic light emitting device according to an exemplary embodiment of the present invention, and FIG. 6 is a cross-sectional view of the organic light emitting device shown in FIG. 5 taken alone the line VI-VI.

Referring to FIG. 5 and FIG. 6, a plurality of gate conductors having a plurality of scanning signal lines 121 including a plurality of first control electrodes 124a, and a plurality of second control electrodes 124b including a plurality of storage electrodes 127 are formed on an insulating substrate 110.

The scanning signal lines 121 transmit scan signals and are substantially extended in the horizontal direction. Each scanning signal line 121 includes an end portion 129 having a large area for contact with another layer or an external driving circuit, and the first control electrodes 124a that are projected upward from the scanning signal line 121. When a scan driver (not shown) generating scanning signals is directly integrated on the substrate 110, the scanning signal line 121 may be extended to be connected to the scan driver.

The second control electrodes 124b are separated from the scanning signal lines 121 and include the storage electrodes 127 extended to one side.

A gate insulating layer 140 preferably made of silicon nitride or silicon oxide is formed on the gate conductors 121 and 124b.

A plurality of semiconductors 154a and 154b are formed on the gate insulating layer 140. The semiconductors 154a overlap the first control electrodes 124a, and the semiconductors 154b overlap the second control electrodes 124b.

A plurality of pairs of first ohmic contacts 163a and 165a and a plurality of pairs of second ohmic contacts 163b and 165b are respectively formed on the semiconductors 154a and 154b. The first ohmic contacts 163a and 165a are disposed on the semiconductors 154a as a pair, and the second ohmic contacts 163b and 165b are disposed on the semiconductors 154b as a pair.

A plurality of data conductors including a plurality of data lines 171, a plurality of driving voltage lines 172, and a plurality of first and second output electrodes 175a and 175b are formed on the ohmic contacts 163a, 163b, 165a, and 165b and the gate insulating layer 140.

The data lines 171 transmit data voltages and are extended in the vertical direction while intersecting the scanning signal lines 121. Each data line 171 includes a plurality of first input electrodes 173a extended toward the first control electrodes 124a, and an end portion 179 having the wide area for connecting with another layer or an external driving circuit. When a data driving circuit (not shown) generating data voltages is directly integrated on the substrate 110, the data lines 171 may be extended to directly connect with the data driving circuit.

The driving voltage lines 172 transmit driving voltages and are extended in the vertical direction while intersecting the scanning signal lines 121. Each of the driving voltage lines 172 includes a plurality of second input electrodes 173b extended toward the second control electrodes 124b, and has portions overlapping the storage electrodes 127.

The first and second output electrodes 175a and 175b are separated from the each other and are also separated from the data lines 171 and the driving voltage lines 172. The first input electrodes 173a and the first output electrodes 175a are opposite to each other on the semiconductors 154a, and the second input electrodes 173b and the second output electrodes 175b are opposite to each other on the semiconductors 154b.

A passivation layer 180 is formed on the data conductors 171, 172, 175a, and 175b, and on the exposed semiconductors 154a and 154b.

The passivation layer 180 has a plurality of contact holes 182, 185a, and 185b respectively exposing the end portions 179 of the data lines 171 and the first and second output electrodes 175b, and the passivation layer 180 and the gate insulating layer 140 have a plurality of contact holes 181 and 184 respectively exposing the end portions 129 of the scanning signal lines 121 and the second input electrodes 124b.

A plurality of pixel electrodes 191, a plurality of connecting members 85, and a plurality of contact assistants 81 and 82 are formed on the passivation layer 180.

The pixel electrodes 191 are physically and electrically connected to the second output electrodes 175b through the contact holes 185b.

The connecting members 85 are connected to the second control electrodes 124b and the first output electrodes 175a through the contact holes 184 and 185a.

The contact assistants 81 and 82 are connected to the end portions 129 of the scanning signal lines 121 and the end portions 179 of the data lines 171 through the contact holes 181 and 182. The contact assistants 81 and 82 enhance the adhesion between the end portions 129 and 179 of the scanning signal lines 121 and the data lines 171, and an external device, and protect them.

A partition 361 is formed on the passivation layer 180. The partition 361 surrounds the edges of the pixel electrodes 191 to define openings 365, and is made of an organic insulator or an inorganic insulator. The partition 361 may be made of a photosensitive material including a black pigment, it has a function of a light blocking member, and its manufacturing process is simple.

A plurality of organic light emitting members 370 are formed in the openings 365. The organic light emitting members 370 is preferably made of an organic material uniquely emitting light of one primary color such as the three primary colors of red, green, and blue. The organic light emitting device displays desired images by spatially combining the light of the primary colors emitted by the organic light emitting members 370. Each of the light emitting members 370 may have a multi-layered structure including an emitting layer (not shown) for emitting light and auxiliary layers (not shown) for improving the efficiency of light emission of the emitting layer.

An explanation of the area of the pixels related to the luminance is described above with respect to FIG. 1 to FIG. 4. Here, the area of the pixels means the area from which the light comes out the display panel, and the area is almost the same as the area of the organic light emitting members 370.

A common electrode 270 is formed on the organic light emitting members 370.

An encapsulation layer (not shown) may be formed on the common electrode 270. The encapsulation layer encapsulates the organic light emitting member 370 and the common electrode 270 to prevent oxidation and moisture from penetrating from the external.

In the organic light emitting device, the first control electrode 124a electrically connected to the scanning signal 121, the first input electrode 173a electrically connected to the data line 171, and the first output electrode 175a form the switching thin film transistor Qs along with the semiconductor 154a, and the channel of the switching thin film transistor Qs is formed in the semiconductor 154a between the first input electrode 173a and the first output electrode 175a. The second control electrode 124b electrically connected to the first output electrode 175a, the second input electrode 173b electrically connected to the driving voltage line 172, the second output electrode 175b connected to the pixel electrode 191, and the semiconductor 154b form the driving thin film transistor Qd, and the channel of the driving thin film transistor Qd is formed in the semiconductor 154b between the second input electrode 173b and the second output electrode 175b. To increase the driving current, the width of the channel of the driving thin film transistor Qd may be increased or the channel length thereof may be shortened.

A pixel electrode 191, an organic light emitting member 370, and the common electrode 270 form an organic light emitting diode LD having the pixel electrode 191 as an anode and the common electrode 270 as a cathode, or vice versa. Also, the storage electrode 127 and the driving voltage line 172 that are overlapped to each other form a storage capacitor Cst.

According to the present invention, a reduction of the life due to the organic light emitting material of the organic light emitting device may be prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising:
a first pixel having a first area displaying red;
a second pixel having the second area displaying green;
a third pixel having a third area displaying blue;
a fourth pixel having a fourth area displaying blue, the first pixel, second pixel, third pixel and fourth pixel positioned adjacent to each other on a plane and forming a dot, and wherein the size of the first area, second area, third area and fourth area are the same,
a signal controller configured to receive and input image signal, the input image signal including a red input luminance for an individual red pixel, a green input luminance for an individual green pixel, and a blue input luminance for an individual blue pixel, the signal controller generating a red output signal based on the red input luminance for the individual red pixel, a green output signal based on the green input luminance for the individual green pixel, a first blue output signal based on the blue input luminance for the individual blue pixel and a second blue output signal based on the blue input luminance for the individual blue pixel; and
a data controller generating a first pixel data voltage based on the red output signal, a second pixel data voltage based on the green output signal, a third pixel data voltage based on the first blue output signal and a fourth pixel data voltage based on the second blue output signal;

wherein the first to fourth pixels respectively comprise a switching element receiving a corresponding data voltage and an organic light emitting element connected to the switching element, a sum of areas of the first to fourth pixels is substantially the same as an area of the dot, and the third pixel and the fourth pixel are simultaneously supplied with third pixel and fourth pixel data voltages that are smaller than the first pixel and the second pixel data voltages at a same time, and, the third pixel data voltage and the fourth pixel data voltage are each, respectively, less than a data voltage for only one blue pixel based on the blue input luminance for the individual blue pixel in a dot including only the individual red pixel, individual green pixel and individual blue pixel positioned adjacent to each other in a plane in which the individual blue pixel has an area equal to the third area of the third pixel.

2. The organic light emitting device of claim 1, wherein a sum of an area of the third pixel and the fourth pixel is larger than an individual area of the first pixel and the second pixel.

3. The organic light emitting device of claim 2, wherein the first to fourth pixels respectively comprise an organic light emitting material, and the organic light emitting material of the third and fourth pixels has a shorter life than a life of the organic light emitting material of the first and second pixels.

4. The organic light emitting device of claim 3, wherein the first to fourth pixels form a rectangle having long sides and short sides, and the first to fourth pixels are arranged in a line in an extended direction of the short sides.

5. The organic light emitting device of claim 4, wherein a length of each the long sides of the first to fourth pixels is four times a length of the short sides.

6. The organic light emitting device of claim 2, wherein the first to fourth pixels form a 2×2 matrix.

7. The organic light emitting device of claim 6, wherein each of the first to fourth pixels is a square.

8. The organic light emitting device of claim 2, wherein areas of each of the first to fourth pixels are substantially the same.

9. The organic light emitting device of claim 1 further comprising:

a scanning signal line transmitting a scanning signal to the third pixel; and a driving voltage line transmitting a driving voltage to the third pixel, wherein the scanning signal line and the driving voltage line cross each other.

10. The organic light emitting device of claim 1, wherein scanning signals applied to the third and fourth pixels are the same.

11. The organic light emitting device of claim 1, wherein a number of grays that the third pixel and the fourth pixel may respectively represent is the same as a number of grays that the first pixel and the second pixel may represent.

12. The organic light emitting device of claim 1, wherein a number of grays that the third pixel and the fourth pixel may respectively represent is less than a number of grays that the first and second pixels may represent.

* * * * *